US006838362B2

United States Patent
Mastromatteo et al.

(10) Patent No.: US 6,838,362 B2
(45) Date of Patent: Jan. 4, 2005

(54) PROCESS FOR MANUFACTURING A THROUGH INSULATED INTERCONNECTION IN A BODY OF SEMICONDUCTOR MATERIAL

(75) Inventors: Ubaldo Mastromatteo, Bareggio (IT); Paolo Ferrari, Gallarate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/406,633

(22) Filed: Apr. 2, 2003

(65) Prior Publication Data

US 2003/0222354 A1 Dec. 4, 2003

(30) Foreign Application Priority Data

Apr. 5, 2002 (EP) .............................................. 02425207

(51) Int. Cl.[7] .............................................. H10L 21/28
(52) U.S. Cl. ...................... 438/524; 438/107; 438/118; 438/125; 438/406; 438/456; 438/533; 438/696; 438/700
(58) Field of Search .................................. 438/107, 118, 438/125, 406, 456, 524, 533, 650, 686, 687, 696, 700, FOR 302, FOR 369

(56) References Cited

U.S. PATENT DOCUMENTS

| | | | | |
|---|---|---|---|---|
| 3,761,782 A | * | 9/1973 | Youmans | 257/778 |
| 4,978,639 A | * | 12/1990 | Hua et al. | 438/465 |
| 5,091,331 A | * | 2/1992 | Delgado et al. | 438/458 |
| 5,272,104 A | * | 12/1993 | Schrantz et al. | 438/105 |
| 5,352,926 A | * | 10/1994 | Andrews | 257/717 |
| 5,426,072 A | * | 6/1995 | Finnila | 438/107 |
| 5,447,871 A | * | 9/1995 | Goldstein | 438/618 |
| 5,753,529 A | * | 5/1998 | Chang et al. | 438/118 |
| 5,757,081 A | * | 5/1998 | Chang et al. | 257/778 |
| 6,313,531 B1 | | 11/2001 | Geusic et al. | |

FOREIGN PATENT DOCUMENTS

| | | |
|---|---|---|
| DE | 198 16 245 A | 10/1999 |
| EP | 0 926 726 A | 6/1999 |
| EP | 0 974 817 A | 1/2000 |
| EP | 1 071 126 A | 1/2001 |
| EP | 1 151 962 A | 11/2001 |
| EP | 02 42 5207 | 11/2003 |
| FR | 2 805 709 A | 8/2001 |
| WO | PCT/US95/05217 | 11/1995 |

* cited by examiner

*Primary Examiner*—George Fourson
*Assistant Examiner*—Joannie Adelle Garcia
(74) *Attorney, Agent, or Firm*—Lisa K. Jorgenson; Bryan A. Santarelli; Graybeal Jackson Haley LLP

(57) ABSTRACT

The process for manufacturing a through insulated interconnection is performed by forming, in a body of semiconductor material, a trench extending from the front (of the body for a thickness portion thereof; filling the trench with dielectric material; thinning the body starting from the rear until the trench, so as to form an insulated region surrounded by dielectric material; and forming a conductive region extending inside said insulated region between the front and the rear of the body and having a higher conductivity than the rear of the body. The conductive region includes a metal region extending in an opening formed inside the insulated region or of a heavily doped semiconductor region, made prior to filling of the trench.

31 Claims, 5 Drawing Sheets

PROCESS FOR MANUFACTURING A THROUGH INSULATED INTERCONNECTION IN A BODY OF SEMICONDUCTOR MATERIAL

PRIORITY

This application claims priority from European patent application No. 02425207.4, filed Apr. 5, 2002, which is incorporated herein by reference.

TECHNICAL FIELD

The present invention relates generally to a process for manufacturing a through insulated interconnection in a body of semiconductor material.

BACKGROUND OF INVENTION

As is known, for manufacturing microsystems comprising elements obtained using different technologies, such as microelectromechanical systems (MEMS) and integrated circuits, there exists the need to electrically connect two opposite faces (front and rear) of substrates integrating electronic components or, generally, carrying passive elements and/or protection structures and/or connection structures to other substrates.

EP-A-0 926 723 describes a process for forming front-rear through contacts in micro-integrated electronic devices. According to this process, a metal contact region extends through a through opening in the chip. In detail, this process is basically made up of the following steps:

1. Formation of metal connection regions on the front of a wafer during formation of the contacts of the device; the metal connection regions are formed at the location where the connection with the rear of the wafer will be made;

2. Etching of the rear of the wafer for partial removal of the substrate in the connection locations with formation of openings passing right through the wafer;

3. Deposition of an insulating layer on the bottom and on the walls of the through cavities;

4. Removal of the insulating layer from the bottom of the cavity to obtain contact areas with the front of the wafer and with the metal connection regions;

5. Deposition or growth from the rear of a metal layer, which coats the walls of the cavities, makes electrical contact with the metal connection regions, and has surface portions on the rear of the wafer; and 6. Formation on the rear of connection regions towards the outside in electrical contact with the surface portions.

In the process described above, the biggest difficulties lie in insulating the through openings (deposition of oxides, nitrides or polymeric materials), in that they have a depth of several tens of microns and have substantially vertical walls.

EP-A-1 151 962 describes a structure for electrical connection between two bodies of semiconductor material obtained by digging trenches of a closed (annular) shape from the front of a first, heavily doped, wafer and filling the trenches with dielectric material. Next, the first wafer is thinned from the rear until the trenches are reached, so obtaining an insulated-silicon area (silicon plug), which connects the front and the rear of the wafer. Next, the first wafer is fixed to a second wafer which houses integrated components. If MEMS are made in the first wafer, it can be used as protection for the MEMS and their connection to the second wafer.

In the above structure, the need to dope the first wafer heavily to reduce resistance of the silicon plugs limits the applicability of this solution. In particular, in the first wafer, only some types of microsystems may be integrated, and normally the integration of active components is not possible.

SUMMARY OF THE INVENTION

An embodiment of the present invention provides a process that will enable a front-rear connection of a wafer of semiconductor material in a simple way and without limiting the type of structures that can be integrated in the wafer.

According to an embodiment of the present invention, there is, thus, provided a process for manufacturing a through insulated interconnection, as well as an integrated electronic device.

BRIEF DESCRIPTION OF THE DRAWINGS

For a better understanding of the present invention, a number of preferred embodiments will now be described, purely by way of non-limiting example, with reference to the attached drawings, in which.

DETAILED DESCRIPTION

Figure 1:
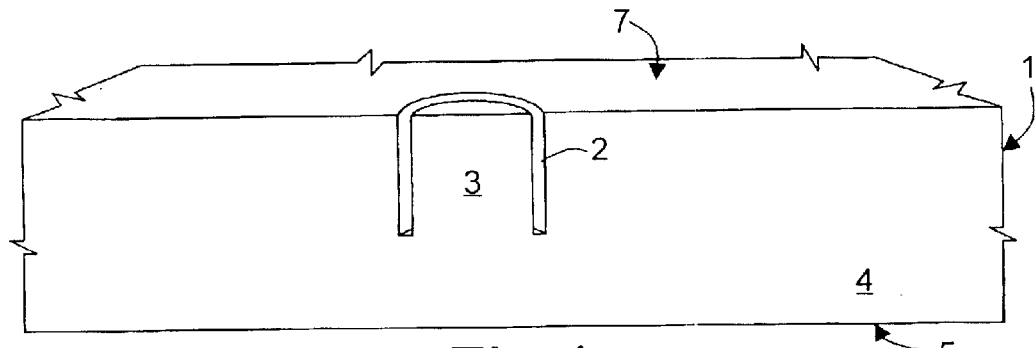
FIG. 1 is a perspective cross-section of a wafer of semiconductor material during an initial fabrication step in accordance with an embodiment of the invention.

With reference to FIG. 1, a first wafer 1 comprising a substrate 4 of semiconductor material, typically monocrystalline silicon doped in a standard way, for example a P-type <100> substrate with a resistivity of 15 $\Omega$/cm, having a first surface 7 and a second surface 5, has undergone steps for making trenches, according to what is described in the above-mentioned patent application EP-A-1 151 962 which is incorporated by reference. In particular, the first wafer 1 has been masked and etched to form deep trenches 2 having a closed shape and surrounding cylindrical regions 3 of monocrystalline silicon. The trenches 2 may have a depth of, for example, 50–100 $\mu$m.

Figure 2:
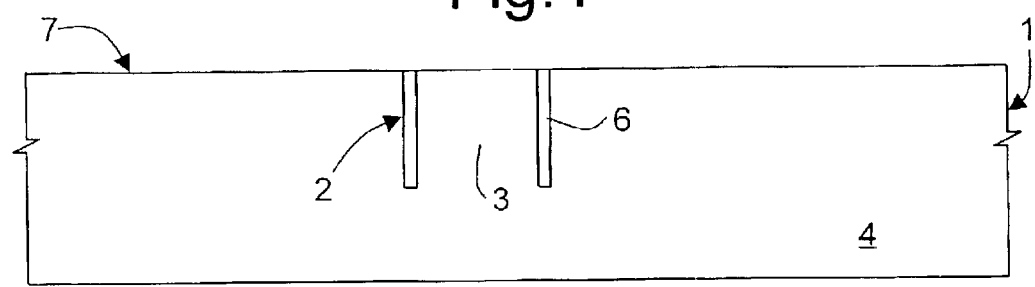
FIGS. 2 to 5 are cross-sections of the wafer of FIG. 1, in subsequent fabrication steps in accordance with an embodiment of the invention.

Next (see FIG. 2), the trenches 2 are filled, either completely or partially, with insulating material 6, for example, silicon dioxide. For this purpose, a silicon dioxide layer is deposited or grown, and is then removed from the first surface 7 of the first wafer 1 to obtain the structure of FIG. 2.

Figure 3:
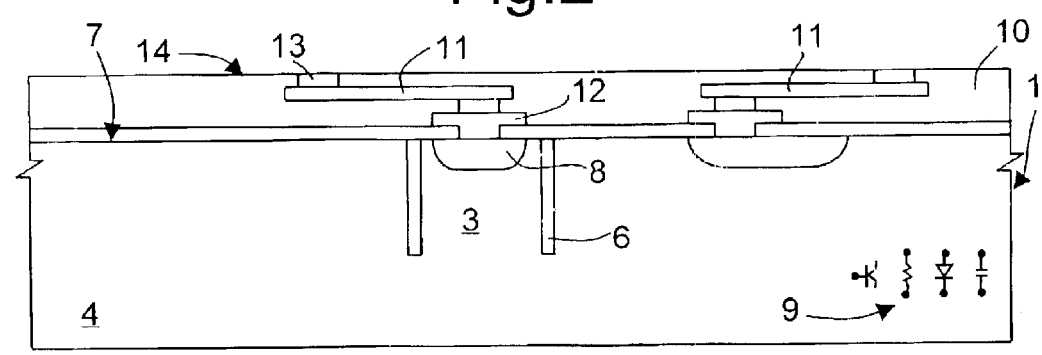

In a known way (see FIG. 3), using implantation, diffusion, deposition and growth steps, inside and on the first surface 7 of the substrate 4, conductive and/or insulating regions are formed, so as to obtain electronic components 9 (schematically represented in FIG. 3) according to the circuit that is to be obtained.

In addition, the surface area of the cylindrical region 3 is doped, so as to reduce the resistivity, thus forming contact regions 8. The contact regions 8 are preferably made simultaneously with diffused areas in the substrate 4.

Next, on top of the first surface 7, insulating layers 10 and metal connection regions 11 are deposited. In the illustrated example, a connection region 11 electrically connects, via contacts 12, 13, the contact region 8 to a top surface 14 of the wafer.

Next (see FIG. 4), the first wafer 1 is bonded to a second wafer 15 comprising at least one substrate 16. The substrate 16 houses conductive and/or insulating regions, which form electronic components 20 (also represented schematically). The substrate 16 may be coated with an insulation and/or passivation layer (not illustrated) housing metal contact regions.

Figure 4:
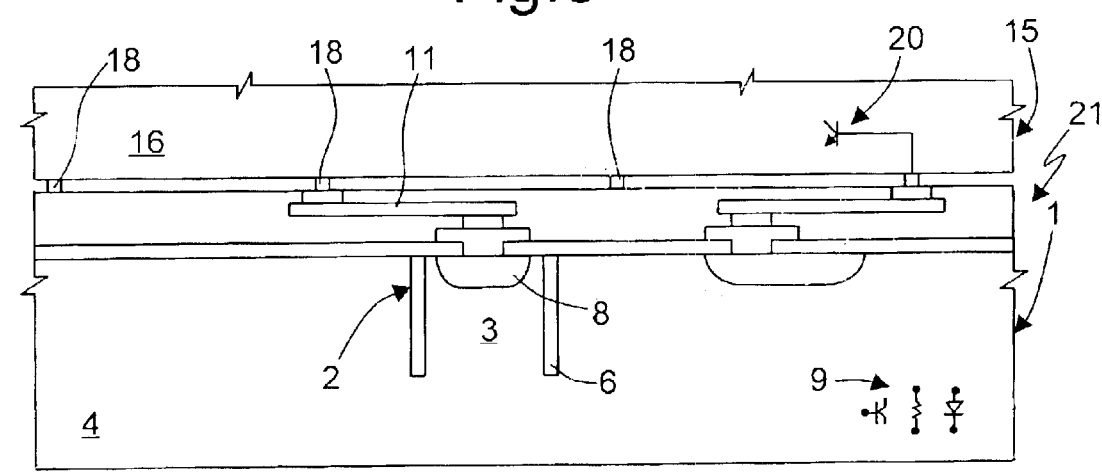

The bonding technique may be direct, by means of palladium/silicon bonds; alternatively, as illustrated in FIG. 4, bonding regions 18 are provided of a suitable material, for example, gold, to form a gold/silicon eutectic, as described in the above-mentioned patent application EP-A-1 151 962, or else a low-melting alloy may be used, such as gold/tin. In this way, the composite wafer 21 is obtained formed by the first wafer 1 and the second wafer 15.

Figure 5:
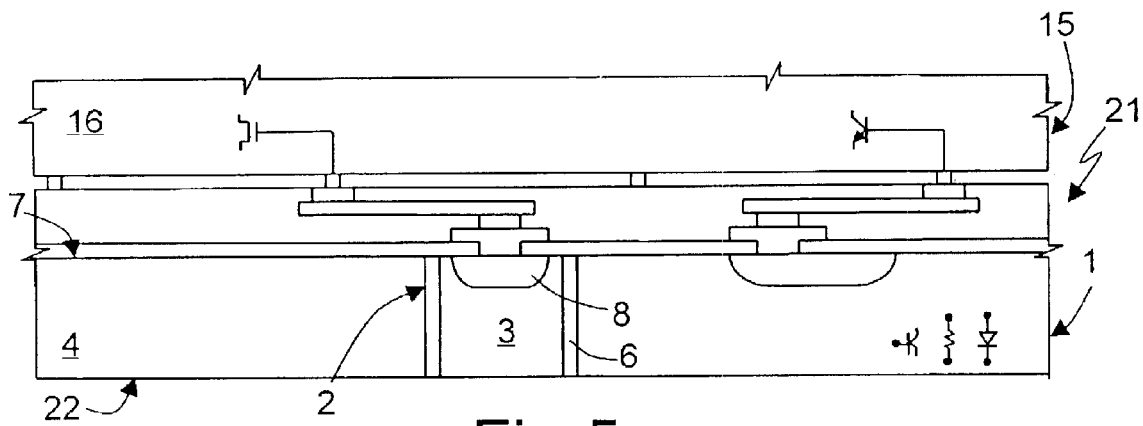

Next (see FIG. 5), the first wafer 1 is thinned from the rear mechanically, for example, by grinding, until the bottom of the trenches 2 are reached, preferably until a thickness of less than 100 $\mu$m is obtained, for example, 50 $\mu$m up to 30 $\mu$m. The first wafer 1 thus has a second surface 22 opposite to the first surface 7 of the substrate 4, and the cylindrical regions 3 are now insulated from the rest of the substrate 4.

Figure 6:
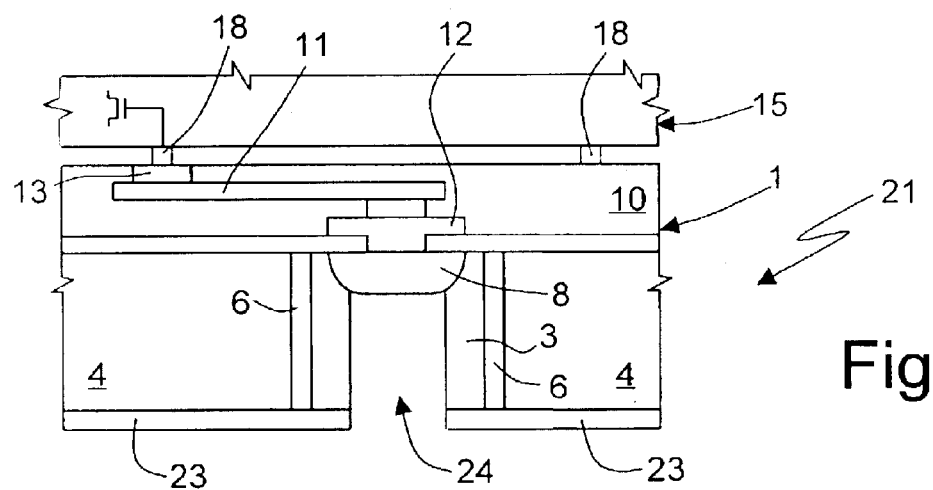
FIGS. 6 to 8 are cross-sections, at an enlarged scale, of a portion of the wafer of FIG. 4, in subsequent fabrication steps in accordance with an embodiment of the invention.

The second surface 22 is then coated with a dielectric layer 23, which is preferably deposited, for insulation of the rear (see FIG. 6).

Using a mask (not shown), the substrate 4 of the first wafer is dug to form openings 24 extending inside the cylindrical regions 3, as illustrated in the enlarged detail of FIG. 6. Preferably, the openings 24 reach the contact regions 8. If these latter regions are not present, the openings 24 may extend until they touch the first surface 7 of the substrate 4.

Figure 7:
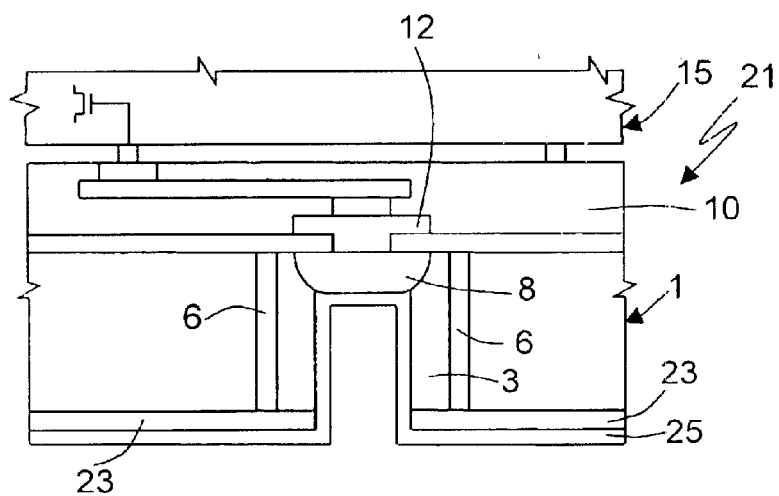

Next (see FIG. 7), a seed layer 25 is deposited on the rear of the first wafer 1, with the aim of favoring the subsequent galvanic growth of metal contact regions. For instance, the seed layer 25 can be obtained by dipping the composite wafer 21 in a bath of palladium, so as to get the palladium to precipitate on top of the dielectric layer 23 and on the walls and on the bottom of the openings 24, and then by depositing gold by reduction (Wet Pd+Au electroless process), or else by low-pressure chemical vapor deposition (LPCVD) of tungsten, or else by phase vapor deposition (PVD) of titanium (Ti sputtering technique).

Next, a dry resist layer (not illustrated) is deposited and shaped, to delimit the areas of the rear of the composite wafer 21 where the galvanic growth is to be obtained, and through contact regions 28 are galvanically grown. For instance, the through contact regions 28 may be made of copper or gilded nickel (Ni/Au). In particular (see FIG. 8), the through contact regions 28 grow inside the openings 24, which can be filled completely or not.

Figure 8:
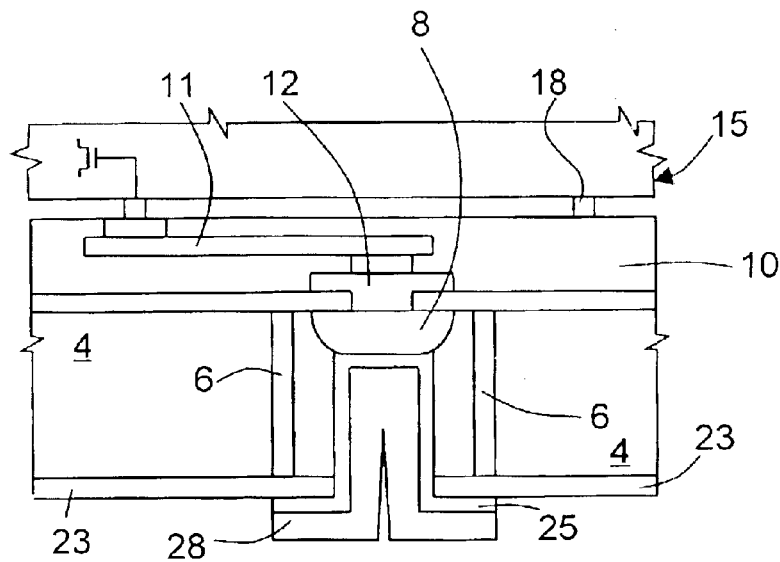

Next, the dry resist layer is removed, and the seed layer 25 is removed, where it is not covered by the through contact regions 28. In this way, the structure illustrated in FIG. 8 is obtained, which shows a through contact region 28 that enables connection of the rear of the first wafer 1 to the front of the same first wafer and with the second wafer 15, through a contact region 8, a metal connection region 11 and contacts 12, 13.

The process may continue with the formation of bumps on the rear in direct electrical contact with the through contact regions 28. The bumps, for example, of gold/tin, may be deposited in a known way using special (electroplating) machines.

The formation of a through-contact structure comprising an insulating region obtained by filling a trench with dielectric material and a metal conductive region inside the insulating region guarantees an excellent insulation (greater than 1000 V) of the conductive region with respect to the rest of the substrate, as well as high reliability.

Figure 9:
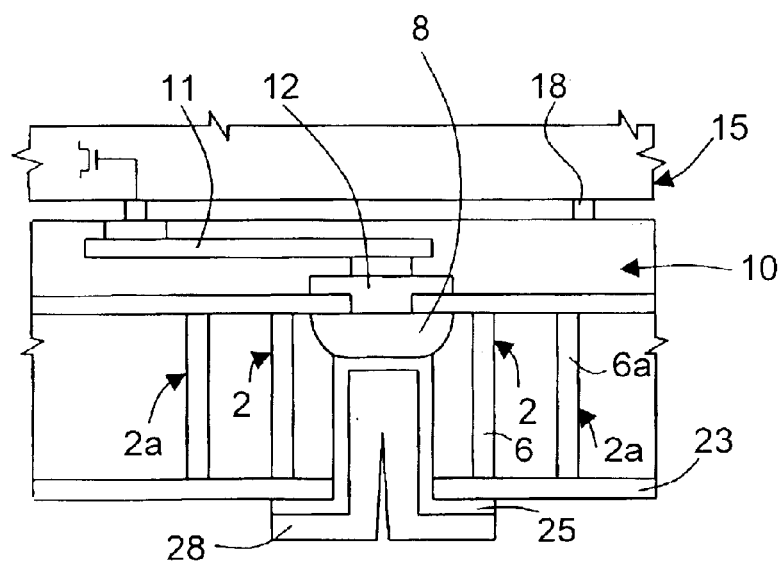
FIG. 9 is a cross-section of a composite wafer according to a variant of FIG. 8 in accordance with an embodiment of the invention.

Should it be necessary to have a greater resistance to high voltages or should there be necessary a capacitive decoupling between the through conductive region and the rest of the substrate, it is possible to provide multiple insulation structures, as illustrated in FIG. 9, wherein a second trench 2a, also filled with dielectric material 6a, is present outside the trench 2 and concentrically thereto. The structure of FIG. 9 may be obtained by adopting the same procedure described above, with the only difference of providing two concentric trenches 2 and 2a simultaneously and filling both of them with dielectric material.

The illustrated structure presents extremely low resistance thanks to the use of metal and to the shortness of the connection between the front and the rear of the first wafer 1.

This embodiment of the present invention allows working the wafer from the rear, for example to form integrated components, in which the second wafer 15 (which has a normal thickness of, for example, 675 $\mu$m for a diameter of 150 mm) may in turn contain integrated components or just have a function of mechanical support during handling of the first wafer.

The operations on the rear may all be carried out at low temperature (except, possibly, for the deposition of dielectric material using the plasma-enhanced chemical vapor deposition (PECVD) technique), and consequently do not interfere with any components that may have been made on the front of the first wafer 1 or in the second wafer 15.

The presence of the contact region 8 enables complete digging of the first wafer 1 to be avoided, and hence simplifies the digging operations and reduces the brittleness of the first wafer 1 itself.

Should it be necessary to have a through-contact structure with very low resistivity, such as the one described previously, it is possible to provide, inside the insulating region 3, doped silicon connections, according to the embodiment described hereinafter.

In detail, initially, the first wafer 1 undergoes a trench etch, in a way similar to the embodiment described above. Also in this case, the first wafer 1 comprises a standard substrate 4, of any thickness and any resistivity, so as to be able to integrate standard electronic components. Consequently, at the end of the etching process, the first wafer 1 has trenches 2 surrounding cylindrical regions 3, as illustrated in FIG. 1. etching process, the first wafer 1 has trenches 2 surrounding cylindrical regions 3, as illustrated in FIG. 1.

Figure 10:
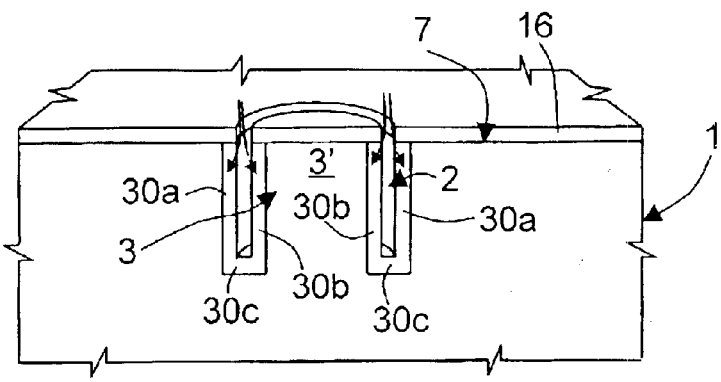
FIG. 10 is a perspective cross-section of a wafer of semiconductor material, in an initial fabrication step, according to a different embodiment of the invention.

Next, as shown in FIG. 10, maintaining the masking layer used for the trench etch, the wafer is doped in an oven. Given the protection of the first surface 7 of the substrate 4 through a protective layer 16 (for example, a silicon dioxide layer), the dopant species diffuse only inside the trenches 2, as indicated by the arrows in FIG. 10. Consequently, on the outer walls and on the inner walls of the trenches 2, outer annular portions 30a and inner annular portions 30b are formed and connected underneath the trenches 2 by bottom portions 30c. The cylindrical regions 3 now each comprise a central region 3', doped in a standard way, and an inner annular portion 30b.

Next (see FIG. 11), the trenches 2 are filled with insulating material 6, in a manner similar to the above, and the structure is planarized.

Then the electronic components (not shown in FIG. 11), the insulation layers 10 on the front of the wafer, the contacts 12, 13, and the metallizations 11 are made, and the first wafer 1 is bonded to the second wafer 15. Here, each contact 12 is in electrical contact with at least the respective inner portion 30b (in this case it may have an annular shape) or with the entire area of the cylindrical region 3 (including both the inner portion 30b and the central region 3').

Figure 12:
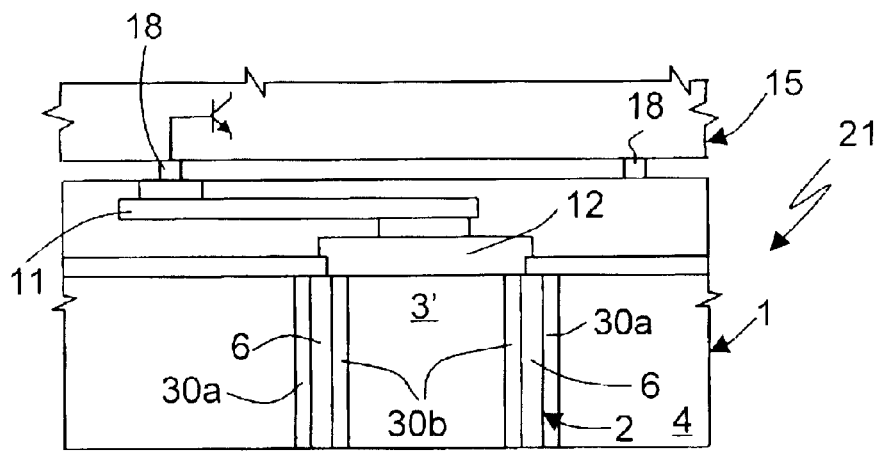

Next (see FIG. 12), the first wafer 1 is thinned from the rear, until at least the trenches 2 are reached. In this way, the bottom portions 30c are removed, and the outer portion 30a and inner portion 30b are no longer electrically connected together. In practice, each central region 3' is now surrounded by a conductive region or via 30b, formed by a respective inner annular portion 30b and insulated from the rest of the first wafer 1 by the insulating material 6.

Next, the first wafer 1 undergoes further fabrication steps, which include the possible formation of components on the rear, and the formation of contacts and/or bumps on the rear.

According to the above solution, by making trenches 2 having an internal diameter of 10 µm, with a final thickness of the first wafer 1, after thinning-out, of 100 µm, the vias 30b have a resistance R of:

$$R = R\frac{100}{2\pi 10} = 1,6R$$

layer resistances of less than 1 Ω/µm, and, hence, resistances R in the region of 1 to 2 Ω. By increasing the radius of the cylindrical regions 3 to a few tens of microns and by reducing the thickness of the first wafer 1 after thinning, to 50 µm, vias 30b with a resistance of down to 100 mΩ are obtained.

Figure 11:
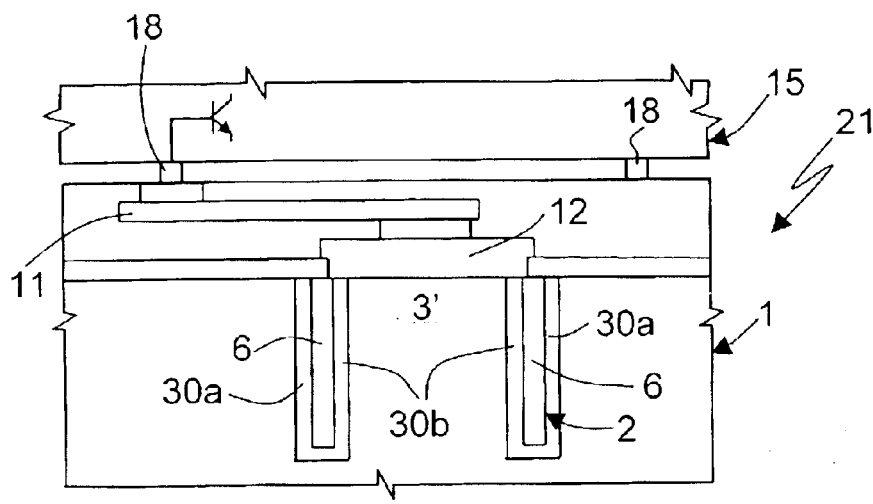
FIGS. 11 and 12 are cross-sections of the wafer of FIG. 10, in subsequent fabrication steps in accordance with an embodiment of the invention.
Figure 13:
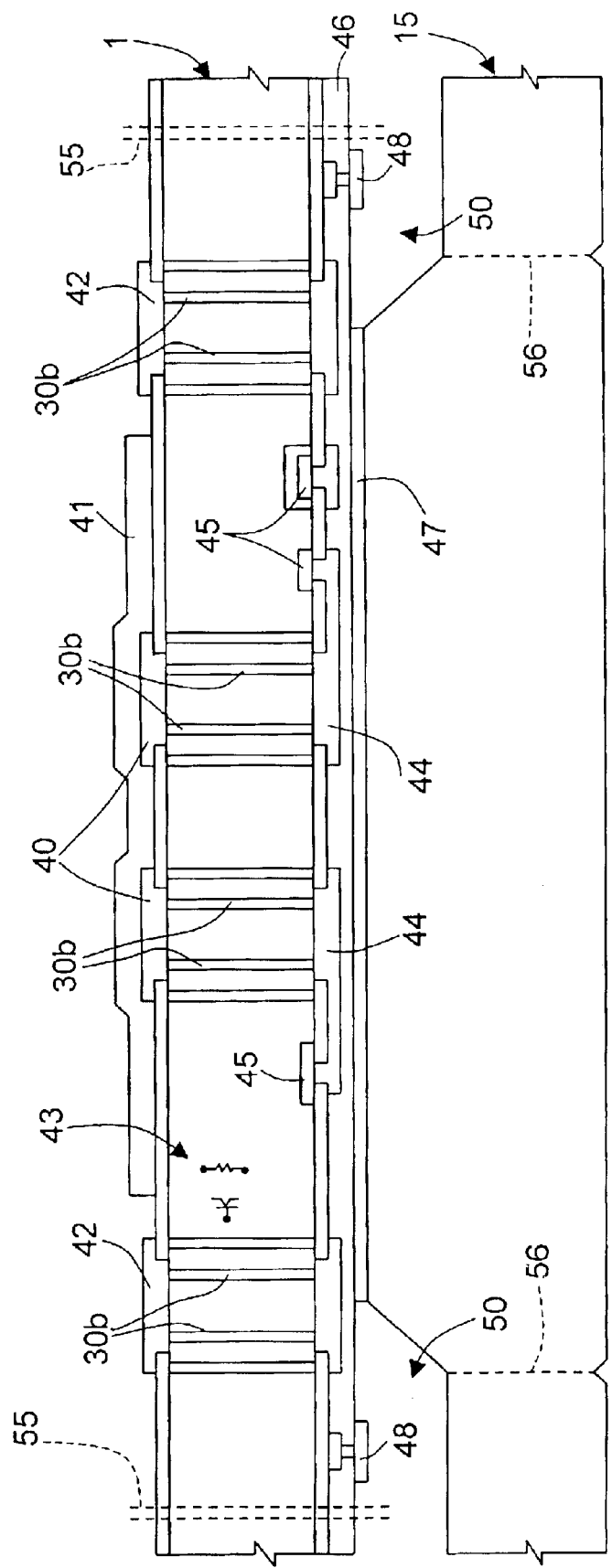
FIG. 13 is a cross-section of a composite wafer integrating a fingerprint sensor, obtained using the technique illustrated in FIGS. 10 to 12 in accordance with an embodiment of the invention.

The embodiment illustrated in FIGS. 10 and 11 may be used for forming a sensor for fingerprints directly on the rear of the wafer, which houses the control circuitry and processing of the signals, as shown in FIG. 13.

The device illustrated in FIG. 13 comprises a first wafer 1, which integrates the components and the electrodes necessary for operation of the sensor, and a second wafer 15, which has purely a supporting function, in order to enable handling of the first wafer 1. On the rear of the first wafer 1, the electrodes are formed. In particular, the reference number 40 designates sensing electrodes for capacitive detection of fingerprints, and the reference number 42 designates electrodes for biasing of the skin. The sensing electrodes 40 are insulated from the environment by a passivation layer 41, while the biasing electrodes 42 are not covered, so as to enable application of the necessary biasing voltages to the skin. The sensing electrodes 40 and the biasing electrodes 42 are connected to the front of the first wafer 1 through the vias 30b, which are made in the way described with reference to FIGS. 10 to 12. The contacts 44 formed on the front connect the vias 30b to the integrated components designated as a whole by 43. The integrated components 43 are made on the front of the first wafer 1 and comprise diffused regions 45.

The front of the first wafer 1 is covered by an insulation and protection region 46, on top of which there is formed an adhesive region 47 and contact pads 48.

The second wafer 15 is bonded to the first wafer 1 at the adhesive region 47, and has cavities 50 facing the first wafer 1 at the contact pads 48. The cavities 50 are formed prior to bonding of the wafers 1, 15 on the front of the second wafer 15.

FIG. 13 also shows scribing lines 55, along which, using a diamond blade, the wafer is cut to obtain a plurality of sensors. The portions of the second wafer 15 on top of the cavities 50 are further removed at the lines 56, for example, by reactive ion etching (RIE) to form a trench etch, so as to enable access to the contact pads 48.

Figure 14:
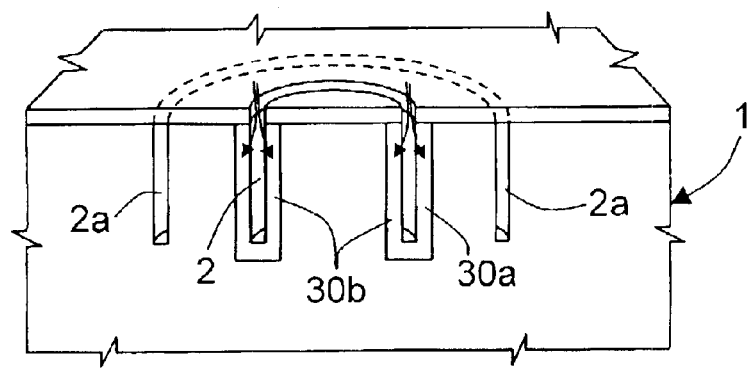
FIG. 14 illustrates a variant of FIG. 9 in accordance with an embodiment of the invention.

In practice, the through contact structure according to FIGS. 10 to 13 comprises, in a way similar to the embodiment illustrated in FIGS. 1 to 9, an insulating region 6, obtained by filling a trench with dielectric material, and a conductive region 30b, formed inside the insulating region. In this case, unlike the first embodiment, the conductive region is formed by a via made of heavily doped semiconductor material. Also in this case, an excellent insulation of the via from the rest of the substrate, as well as high reliability, is obtained, and in the case where an even higher breakdown voltage is required, it is possible to make a double insulation of the type illustrated in FIG. 9. For this purpose, using an additional mask, two mutually concentric trenches 2, 2a are made, and doping is performed in the oven in only the more internal trench (FIG. 14).

Finally, numerous modifications and variations may be made to the process and device described and illustrated herein, all falling within the scope of the invention, as defined in the attached claims. For instance, it is possible to repeat the described steps, bonding the composite wafer 21 to a third wafer, in which the trenches have already been formed and filled and in which the electronic components and the corresponding connections have already been made, then thinning the third wafer and making the through conductive regions before or after bonding and thinning. By repeating the above operations even a number of times, it is possible to make a stack of wafers piled on top of one another and connected together by conductive regions that are insulated from the rest of the respective wafer and have a much lower conductivity than that of the respective wafer.

Furthermore, an integrated circuit, such as a finger-print detector, that includes one of the above-described via structures may be included in an electronic system, such as a finger-print detection system.

What is claimed is:

1. A process for fabrication of a through insulated interconnection, comprising the steps of:
   in a first body of semiconductor material having a thickness, a first and a second surface, forming a first trench extending from said first surface of said first body for a portion of said thickness;
   filling said first trench with dielectric material;
   doping an insulated region surrounded by said first trench;
   thinning said first body starting from said second surface until said first trench, so as to form a thinned body, having a third surface and housing said insulated region surrounded by said dielectric material; and
   forming a conductive region extending inside said insulated region between said first surface and said third surface and having conductivity higher than said thinned body.

2. The process according to claim 1, wherein said step of forming a first trench comprises etching said first body along a closed line.

3. The process according to claim 1, wherein said thinned body has a resistivity of between 1 Ω/cm and 100 Ω/cm.

4. The process according to claim 1, comprising, prior to said step of thinning, forming, in said first body, integrated electronic components facing one another and/or on top of said first surface.

5. The process according to claim 1, further comprising forming at least one further trench surrounding said first trench and filling said further trench with insulating material.

6. The process according to claim 5, wherein said steps of forming a first trench and a further trench are performed simultaneously and said steps of filling said first trench and said further trench are performed simultaneously.

7. The process according to claim 1, further comprising bonding a supporting body on said first surface of said first body prior to said step of thinning.

8. The process according to claim 1, wherein said step of forming a conductive region comprises forming a contact region of metal material.

9. The process according to claim 8, wherein said step of forming a contact region comprises forming an opening in said insulated region, starting from said third surface up to approximately said first surface, and forming said contact region inside said opening.

10. The process according to claim 1, wherein said step of forming a conductive region comprises forming a contact region of semiconductor material having a higher doping level than said first body.

11. The process of claim 1 wherein doping said insulated region comprises doping a portion of said insulated region contiguous with said first surface.

12. The procession of claim 1 wherein forming the conductive region comprises:
   forming an opening in said insulated region; and
   forming a layer of conductive material inside of the opening.

13. A process for fabrication of a through insulated interconnection, comprising the steps of:
   in a first body of semiconductor material having a thickness, a first and a second surface, forming a first trench extending from said first surface of said first body for a portion of said thickness;
   filling said first trench with dielectric material;
   thinning said first body starting from said second surface until said first trench, so as to form a thinned body, having a third surface and housing an insulated region surrounded by said dielectric material;
   forming a conductive region extending inside said insulated region between said first surface and said third surface and having conductivity higher than said thinned body;
   bonding a supporting body on said first surface of said first body prior to said step of thinning; and
   prior to said bonding step, forming integrated electronic components in said supporting body and forming interconnection and bonding regions on top of said first surface and/or on top of a surface of said supporting body facing said first surface.

14. A process for fabrication of a through insulated interconnection, comprising the steps of:
   in a first body of semiconductor material having a thickness, a first and a second surface, forming a first trench extending from said first surface of said first body for a portion of said thickness;
   filling said first trench with dielectric material; and
   thinning said first body starting from said second surface until said first trench, so as to form a thinned body, having a third surface and housing an insulated region surrounded by said dielectric material;
   forming a conductive region extending inside said insulated region between said first surface and said third surface and having conductivity higher than said thinned body;
   wherein said step of forming a conductive region comprises forming a contact region of metal material; and
   wherein said step of forming a contact region comprises forming an opening in said insulated region, starting from said third surface up to approximately said first surface, and forming said contact region inside said opening, forming a seed layer covering said third surface and side walls and a bottom wall of said opening, and selectively growing a metal layer on top of said seed layer.

15. A process for fabrication of a through insulated interconnection, comprising the steps of:
   in a first body of semiconductor material having a thickness, a first and a second surface, forming a first trench extending from said first surface of said first body for a portion of said thickness;
   filling said first trench with dielectric material; and
   thinning said first body starting from said second surface until said first trench, so as to form a thinned body, having a third surface and housing an insulated region surrounded by said dielectric material;
   forming a conductive region extending inside said insulated region between said first surface and said third surface and having conductivity higher than said thinned body;
   wherein said step of forming a conductive region comprises forming a contact region of metal material; and
   wherein said step of forming a contact region comprises forming an opening in said insulated region, starting from said third surface up to approximately said first surface, and forming said contact region inside said opening;
   wherein, before said step of thinning, doping a surface portion of said insulated region, and
   wherein said step of forming an opening comprises digging said thinned body, starting from said third surface until said surface portion is reached.

16. The process according to claim 15, wherein said step of doping is performed simultaneously with a step of forming electronic components in said first body.

17. A process for fabrication of a through insulated interconnection, comprising the steps of:
   in a first body of semiconductor material having a thickness, a first and a second surface, forming a first trench extending from said first surface of said first body for a portion of said thickness;
   filling said first trench with dielectric material; and
   thinning said first body starting from said second surface until said first trench, so as to form a thinned body, having a third surface and housing an insulated region surrounded by said dielectric material;

forming a conductive region extending inside said insulated region between said first surface and said third surface and having conductivity higher than said thinned body;

wherein said step of forming a conductive region comprises forming a contact region of semiconductor material having a higher doping level than said first body; and wherein said step of forming a contact region is performed prior to said step of thinning said first body.

18. A process for fabrication of a through insulated interconnection, comprising the steps of:

in a first body of semiconductor material having a thickness, a first and a second surface, forming a first trench extending from said first surface of said first body for a portion of said thickness;

filling said first trench with dielectric material; and thinning said first body starting from said second surface until said first trench, so as to form a thinned body, having a third surface and housing an insulated region surrounded by said dielectric material;

forming a conductive region extending inside said insulated region between said first surface and said third surface and having conductivity higher than said thinned body;

wherein said step of forming a conductive region comprises forming a contact region of semiconductor material having a higher doping level than said first body; and wherein said step of forming a contact region is performed prior to said step of filling and comprises doping said first body in proximity to side walls of said first trench to form a via of semiconductor material contiguous to said trench.

19. The process according to claim 18, wherein said step of doping is carried out in an oven.

20. A method comprising:

forming a first trench through a first surface of a first substrate also having a second surface opposite the first surface, the trench enclosing an inner region of the first substrate;

attaching a second substrate to the first surface of the first substrate;

exposing the trench through the second surface of the first substrate; and forming a conductive through contact within the inner region of the first substrate enclosed by the trench by doping the inner region.

21. The method of claim 20, further comprising filling the first trench with an insulating material.

22. The method of claim 20 wherein forming the conductive through contact comprises:

removing at least a portion of the inner region of the first substrate to generate a void enclosed by the trench; and filling the void with a conductive material.

23. The method of claim 20, further comprising:

forming a second trench in the first substrate around the first trench; and filling the second trench with an insulating material.

24. The method of claim 20 wherein forming the conductive through contact comprises doping a portion of the inner region contiguous with the first surface of the first substrate.

25. A method comprising:

forming a first trench through a first surface of a first substrate also having a second surface opposite the first surface, the trench enclosing an inner region of the first substrate;

attaching a second substrate to the first surface of the first substrate;

exposing the trench through the second surface of the first substrate;

forming a conductive through contact within the inner region of the first substrate enclosed by the trench; and doping a sidewall of the first trench.

26. A method, comprising:

forming a trench through a first surface of a substrate also having a second surface opposite the first surface, the trench enclosing an inner region of the first substrate;

filling the trench with an insulator;

exposing the inner region through the second surface of the substrate; and doping the inner region to form a conductive via that extends between first and second surfaces of the inner region.

27. The method of claim 26 wherein doping the inner region comprises doping the inner region after forming the trench.

28. The method of claim 26 wherein doping the inner region comprises doping the inner region after forming the trench but before filling the trench with the insulator.

29. The method of claim 26 wherein doping the inner region comprises doping an inner side wall of the trench.

30. The method of claim 26, further comprising forming a contact on the inner region adjacent to the second surface of the substrate.

31. The method of claim 26 wherein:

the first surface of the inner region is adjacent to the first surface of the substrate; and the second surface of the inner region is adjacent to the second surface of the substrate.

* * * * *